United States Patent [19]
Rossi et al.

[11] Patent Number: 5,578,956
[45] Date of Patent: Nov. 26, 1996

[54] CIRCUIT FOR LIMITING THE MAXIMUM CURRENT VALUE SUPPLIED TO A LOAD BY A POWER MOS AT POWER-UP

[75] Inventors: Giorgio Rossi, Nerviano; Fabio Marchioó, Sedriano; Liana Luoni, Como; Franco Cocetta, Cornaredo, all of Italy

[73] Assignee: SGS-Thomson Microelectronics, S.r.l., Agrate Brianza, Italy

[21] Appl. No.: 615,729

[22] Filed: Mar. 14, 1996

Related U.S. Application Data

[63] Continuation of Ser. No. 316,042, Sep. 30, 1994, abandoned.

[30]    Foreign Application Priority Data

Sep. 30, 1993  [EP]  European Pat. Off. ............... 93830400

[51] Int. Cl.⁶ ..................................................... H03K 5/08
[52] U.S. Cl. ........................... 327/309; 327/325; 327/365
[58] Field of Search ..................................... 323/313, 315; 327/72, 108–111, 306, 309, 312, 313, 325, 327, 365, 378, 427, 432, 324, 374, 376, 478, 560, 561, 562, 563; 326/17, 18, 20

[56]    References Cited

U.S. PATENT DOCUMENTS

| | | | |
|---|---|---|---|
| 4,777,387 | 10/1988 | Collins | 327/109 |
| 4,833,342 | 5/1989 | Kiryv et al. | 323/313 |

*Primary Examiner*—Timothy P. Callahan
*Assistant Examiner*—Jeffrey Zweizig
*Attorney, Agent, or Firm*—Robert Groover; Betty Formby

[57]    ABSTRACT

The invention concerns a circuit for limiting the maximum current to be supplied to a load through a power MOS, being an improvement of the limiting circuitry which uses an equalizing capacitor. The addition of circuitry with a one-way current flow between a terminal of the equalizing capacitor and the gate terminal of the power MOS is effective to lower the voltage across the capacitor and to speed up its charging process, thereby making the current limiting action expected from the circuit a timely one. The circuitry which limits current flow to one direction may include a second MOS of the same type as the power MOS. In this way, any deviations of the power MOS from its designed operation, e.g. due to its manufacturing process variation and thermal drift phenomena, can also be compensated.

17 Claims, 2 Drawing Sheets

CIRCUIT FOR LIMITING THE MAXIMUM CURRENT VALUE SUPPLIED TO A LOAD BY A POWER MOS AT POWER-UP

This application is a continuation of application Ser. No.08/316,042, filed Sep. 30. 1994 and now abandoned.

CROSS-REFERENCE TO RELATED APPLICATION

This application claims priority from EPC App'n 93830400.3, filed Sep. 30, 1993, which is hereby incorporated by reference.

BACKGROUND AND SUMMARY OF THE INVENTION

This invention relates to a circuit for limiting the maximum current to be supplied to a load from a power MOS, in particular a current which is regulated by means of an equalizing capacitor.

Specifically, the invention concerns a circuit for limiting the maximum current to be supplied to a load from a power MOS, where the load is connected to a terminal of an external voltage supply and to the drain terminal of said power MOS, the circuit being of a type which comprises:

- a current generator connected to the gate terminal of the power MOS,
- a resistance connected to the source terminal of the power MOS and to the ground terminal,
- an amplifier which consists of,
- an input stage comprising a pair of transistors whose collectors are connected to the output terminals of a current mirror circuit, and whose bases are connected to each other through a series of two resistances having the same value, the emitter of the first transistor being connected to the ground terminal, the emitter of the second transistor being connected to the source terminal of the power MOS, and the terminal shared in common by said resistances of equal value being connected to a terminal of a voltage reference,
- an output stage comprising a bipolar transistor of the pnp type having its emitter connected to the gate terminal of said power MOS, collector connected to ground, and base connected to the collector of the first of said pair of input stage transistors, and
- an equalizing capacitance connected between the collector and the base of the first of said input stage transistors of said amplifier.

There are several ways of limiting the current rating to a load through an output terminal of a power MOS. The most widely used one in the art uses a feedback network which comprises an amplifier having one input connected to a reference voltage, the other input connected to a resistor which senses the current being flowed through the load, and the output connected to the gate terminal of the power MOS.

That amplifier basically performs a comparison between the reference voltage and that applied to the other of its inputs which increases with the current across the load. As these two voltages tend to equal each other, the amplifier operates by its output to limit the voltage at the gate of the power MOS, thereby also limiting the current at the output terminal connected to the load.

A major problem to be addressed in such negatively fed back arrangements is that of stability, especially where the connected load is of the inductive type. In fact, the power MOS would tend to enter oscillation as soon as the amplifier is operated.

To obviate this drawback, the prior art has provided an equalizing capacitor in the circuit structure of the amplifier which is designed to stabilize the overall arrangement.

The introduction of that capacitor delays, however, the amplifier intervention, i.e. the limiting action on the load current, until the capacitor is fully charged. In the meantime, the load current may well rise above its desired strength with nothing to limit it. This particularly holds if the intrinsic input capacitance of the power MOS becomes charged ahead of the equalizing capacitor. In fact, since any MOS is bound to possess a certain input capacitance, its gate voltage, and hence its output current, would increase according to a time constant which is effectively tied to that input capacitance. Should the equalizing capacitor become charged at a slower rate, there would be a time period when the output current from the power MOS is no longer controlled. This may result in load current overshooting, that is load current values which exceed the rated value that the limiter circuit is to maintain.

Another factor which may practically defeat an accurate and effective limitation of the output current from a power MOS is the uncertainty of its (output) characteristic slopes due to manufacture processing (process spread) and to temperature variations (thermal drift).

The manufacturing processes frequently result in an actual device whose effective characteristic slopes depart from the theoretical ones set by its designer.

This means, for example, that if a given potential difference Vgs is applied between the source and the gate terminals, the current Id at the drain terminal will not be as expected, i.e. as inferable from the characteristic output slopes supplied by the manufacturer, and rather have a slightly different value. Thus, the MOS might fail to go on, or operate within the resistive range. Likewise, temperature variations from the design working value bring about changes in the characteristic slopes of the MOS which may perturb its expected performance. The above factors alter the operating conditions of the limiter circuit for the output current of a power MOS from those anticipated at the designing stage, which are based essentially on theoretical characteristic slopes. This may again result in inaccurate and/or untimely action of the limiter circuit, thereby dwarfing the benefits that the latter could bring about for the overall supply circuit of a load.

The disclosed innovations advantageously provide a circuit for limiting the maximum current to be supplied to a load through a power MOS, in particular a circuit which uses an equalizing capacitor, wherein the equalizing capacitor is charged at a faster rate than the intrinsic capacitance of the power MOS, so that it can intervene before the current at the load exceeds the maximum desired value.

The disclosed innovations advantageously provide a circuit as specified above, which is unaffected by process spreads and thermal drifts of the power MOS, such as would otherwise make its limiting action inaccurate and/or untimely.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
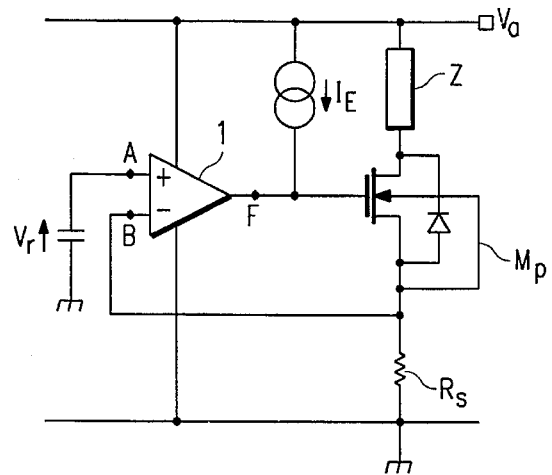
FIG. 1 is a block diagram of a prior art circuit for limiting the maximum current to be supplied to a load through an output terminal of a power MOS.

The numerous innovative teachings of the present application will be described with particular reference to the presently preferred embodiment (by way of example, and not of limitation), in which:

The block diagram of FIG. 1 is representative of the arrangement commonly adopted in the prior art for limiting a current I being supplied to a load Z and fixing it at a constant value using a power MOS.

As can be seen, the load Z is connected between a terminal of an external voltage supply Va and one of the two output terminals of a power MOS, Mp, which is represented by its drain terminal in the drawing figure. Respectively connected to the two inputs A and B of amplifier 1 are a terminal of resistor Rs and the positive pole of a reference voltage Vr. The amplifier output is connected directly to the gate terminal of Mp to which a current generator Ig is also connected. Flowed through the resistor Rs is the same current I as is flowed through the load Z, and accordingly, the ground-going voltage drop which occurs across the resistor will increase with I. As this voltage tends to exceed the reference voltage Vr, the amplifier 1 intervenes with its output F to tap current off the generator Ig. Thus, the voltage across the gate of Mp will be lowered, and the load current along with it.

Figure 2:
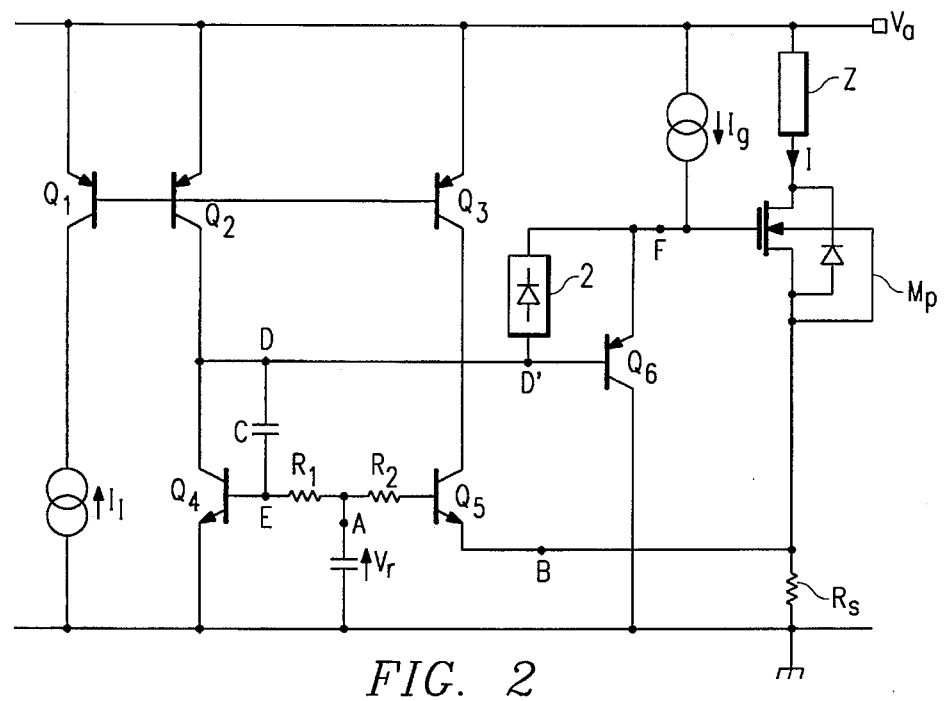
FIG. 2 shows in diagram form the limiter circuit of this invention.

Shown diagrammatically in FIG. 2 is a limiter circuit according to the invention. Except for circuit block 2, the circuit represents a known embodiment of the block diagram shown in FIG. 1 as discussed above. Thus in FIG. 2, bipolar transistors Q4 and Q5 represent the input stage of the amplifier 1, bipolar transistor Q6 of the pnp type represents the output stage of the amplifier 1, capacitor C represents the equalizing capacitance, resistors R1 and R2 have the same resistance value, and transistors Q1, Q2 and Q3 constitute the current mirror circuit connected by its output terminals to the collectors of the transistors Q4 and Q5 in the input stage of the amplifier 1.

The output stage of the amplifier 1 can also be implemented by the Darlington connection of a pnp transistor and an npn transistor between the same terminals of Q6.

The terminal in common between said resistors R1 and R2 constitutes the input A of the amplifier 1, that is, the terminal connected to the reference potential Vr, while the emitter of Q5 constitutes the other input B of that amplifier.

By placing the capacitor C between the collector D and the base E of the transistor Q4, the value of C required to regulate the overall circuit can be reduced. That capacitor would be charged by the base currents of Q4 and Q5 which, as is well recognized, are quite small, and since the voltage across it can be a relatively high value, it can become charged after the intrinsic capacitance of the MOS Mp is charged, with the attendant disadvantages mentioned in the foregoing.

Specifically, as the voltages across Rs increases, i.e. as the load current I increases, the voltage Vbe between the base and the emitter of Q5 will decrease, with the potential at point A being fixed. Upon the voltage across Rs reaching the value of the potential Vr, said Vbe becomes very small and the transistor Q5 turns off. The input stage of the amplifier 1 is, therefore, unbalanced, and Q4 would tend to draw more current through the base of Q6, turning the latter on. In this way, some of the current Ig would be drained off the emitter of Q6, thereby decreasing the voltage at the gate of Mp, and hence the load current I. But, if the capacitor C has not yet been charged, Q4 will tap current off the base of Q6, thereby leaving it in the "on" state, and the gate of Mp can continue to draw current from Ig while causing the load current I to increase.

By introducing the circuit block 2 shown in FIG. 2, the capacitor C can be charged at a faster rate and the amplifier is allowed to intervene timely with its output F to limit the current I.

That circuit block 2, being connected between the collector of Q4 and the gate of Mp, is made up of circuit means exhibiting a one-way current flow from the collector of Q4 to the gate of Mp. Their function is one of lowering the potential at point D such that the voltage VDE across C can be made small, and C can be charged very rapidly.

In fact, if the circuit means 2 were not there, the voltage VDE across C, as is readily inferred from the circuit diagram of FIG. 2, would be given by the following relation:

$$VDE = Va - VecQ2 - VbeQ4, \qquad (a)$$

where, Va is the supply voltage (having a fairly high value on account of Mp being a power MOS), VecQ2 is the voltage between the emitter and the collector of the transistor Q2 included in said mirror circuit, and VbeQ4 is the voltage between the base and the emitter of the transistor Q4.

That value of Vde may be sufficiently high to cause C to become charged at a slower rate than the intrinsic capacitance of Mp.

Consider, for example, the integrated circuit embodiment of FIG. 2 if circuit means 2 were omitted. In this embodiment, in order to make the voltage across Rs—which depends on the difference between the Vbe's of Q5 and Q4—sufficiently large, a transistor Q5 is provided which has an emitter area n times as large as that of Q4, where n is an integer (e.g. n=5). On the circuit being turned on, Q5 will tend to draw a current from the collector of Q3 which is n times as large as that drawn by Q4 from the collector of Q2. The current mirror circuit comprised of Q1, Q2 and Q3 becomes unbalanced and fails to set the same current (I1) at its output terminals, in fact the collectors of Q2 and Q3. Q2 and Q3 have the same base current, but the collector current of Q3 is n times that of Q2. It follows that Q2 will operate in saturation, and therefore, that VecQ2 is the saturating voltage. Thus, VDE will take a fairly high value, as brought out by relation (a).

By providing the circuit means 2, the potential at point D is tied to that taken by the terminal D' of said means 2, and since the gate potential of the MOS Mp is zero, that potential will be, upon turning on, equal to the voltage drop that occurs therein as it starts conducting. Such circuit means comprise a diode whose anode is connected to the collector of Q4, i.e. coincident with point D', so that the potential at point D would become equal to the threshold voltage of that diode, or to the sum of a number of like terms where more than one diode connected serially together are provided. That voltage, that is the potential at point D, is at all events made sufficiently small, and therefore, the voltage VDE is made small. This ensures that the equalizing capacitor C is charged more rapidly than the intrinsic capacitance of the MOS Mp.

Figure 3:
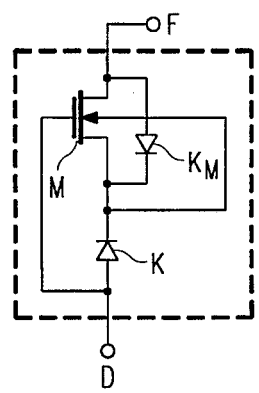
FIG. 3 shows a particular embodiment of the circuit arrangement shown in FIG. 2.

FIG. 3 illustrates the preferred embodiment of the circuit means 2. This preferred embodiment consists of a diode K and a MOS M connected to each other. Specifically, the diode K has its anode connected to the gate of M, as well as to the point D', while its cathode is connected to the drain of the MOS. The latter has its source connected to the gate of Mp. Upon the overall circuit being turned on, the diode K will tap current off the collector of Q2 (through the D—D' shunt) and turn on the MOS M. The potential at point D', or point D of C, will then equal the voltage Vgs between the source and the gate of M, such that VDE=VgsM−VbeQ4 and that value will be fairly small.

Once the input stage of the amplifier 1 is unbalanced and the transistor Q6 begins to conduct, drawing current from the gate of Mp, the MOS M turns off because its Vgs has become equal to the voltage between the base and the emitter of Q6, and that voltage is too small to hold M on. The diode K prevents, inter alia, current from flowing between the gate of Mp and the terminal D through the intrinsic diode KM of the MOS M, should the former attain, during its charging process, a higher potential than the latter.

If the MOS M is of the same type as the power MOS Mp, that is a power MOS itself and implemented in the same technology as Mp, then its presence in the limiter circuit ensures that the aforementioned variations—originating from the manufacturing process and thermal drift phenomena—of Mp from its theoretical operation as evaluated at the designing stage will be compensated for.

This can be accomplished if the whole limiter circuit is implemented in integrated form on one silicon chip. For such an integrated embodiment of the limiter circuit, it is preferred that said diode D be provided by a bipolar transistor of the npn type having its emitter connected to its base and the base in turn connected to the gate of M, as well as its collector connected to the drain of M.

Figure 4:
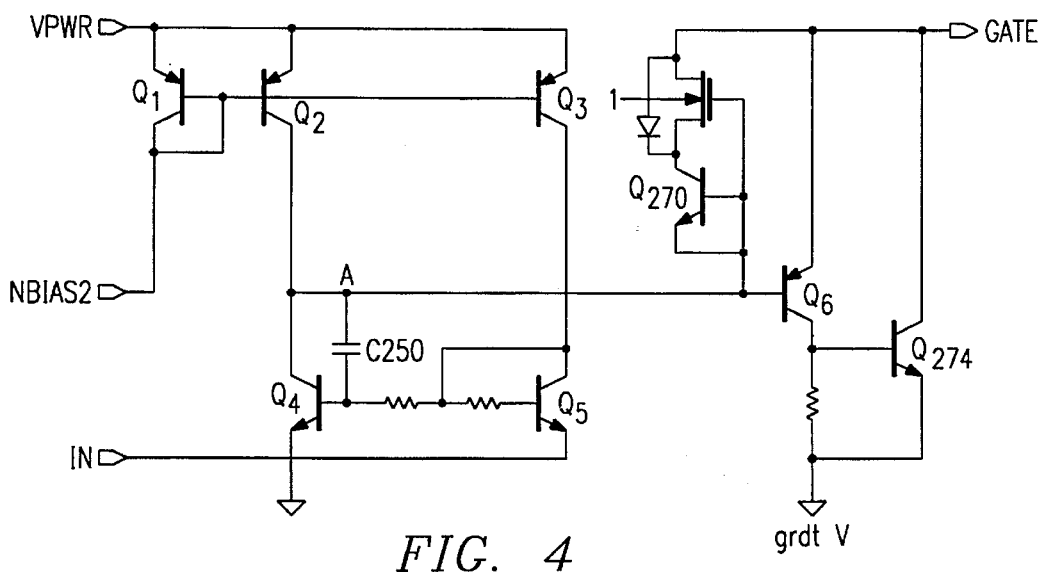
FIG. 4 shows additional detail regarding the embodiment of FIG. 3.

FIG. 4 shows additional detail regarding the embodiment of FIG. 2. Specifically, FIG. 4 shows a sample realization of an amplifier which may be advantageously substituted for amplifier 1 in FIG. 1. As noted above, the compensating capacitor C250 is charged by the base current of transistors Q4 and Q5, and this may be too slow if the voltage on the capacitor is brought up to the large voltage used in the prior art. However, the present invention reduces the voltage on this capacitor, in a process—and temperature-dependent way, by using the process—and temperature-dependent gate voltage of added MOS transistor 283. Since the voltage on its terminals is reduced, the compensating capacitor will charge more quickly.

Due to temperature coefficients and process spread, the turn-on characteristics of the power MOS will be affected, but M283 will be affected in the same way, since M283 is made in the same technology and in the same process batch. Therefore, the effect of such variations will be compensated in the precharge circuit. (All of this causes the intervention of the current limiting circuit to be much quicker, and this avoids overshoot).

Figure 5:
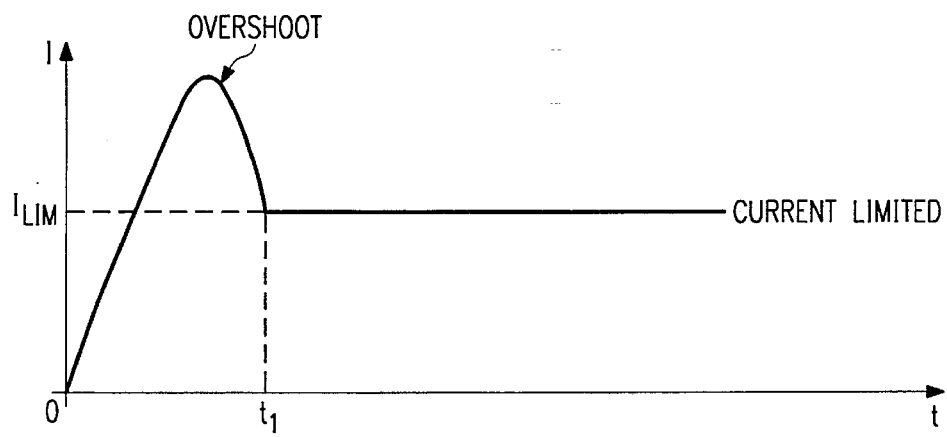
FIG. 5 shows a graph of current immediately after the circuit is turned on in the prior art.
Figure 6:
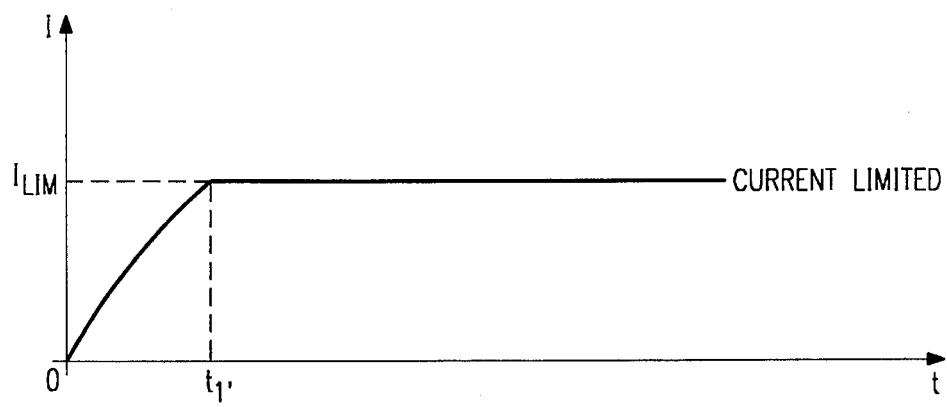
FIG. 6 shows a graph of current immediately after the circuit is turned on when the invention is used.

FIG. 5 clearly points out a shortcoming of the Prior Art; FIG. 6 clearly shows how the present invention will solve the problem.

In general, the disclosed inventions provide current-limiting. In known circuits the current is not limited when the device is turned on, since the circuit for limiting the current does not operate. Therefore, the current amplitude has a peak as shown in FIG. 5.

The circuit for limiting the current does not intervene until the time $t_1$, because the equalizing capacitor is not completely charged and the loop of the feedback amplifier which regulates the current limiting (linear) does not have the time to react until $t_1$.

Because of the presence of the element 2 in the disclosed invention, the equalizing capacitor is precharged by the element 2 itself. The capacitor is charged more rapidly because there is a lower voltage at its ends.

In this case the loop of the amplifier can react at time $t_1'$, before the time t1 and the behavior of the current Of course, the disclosed inventions can be modified in a tremendous variety of ways. For example, the differential comparator circuit does not have to be implemented by the specific configuration shown in the drawings, (e.g. $R_1/R_2/Q_4/Q_5$ in FIG. 2), but can be implemented in a large variety of other ways. Moreover, additional components and circuit functions can easily be added if desired. Accordingly, the scope of the present invention is not defined except by the claims.

What is claimed is:

1. A power integrated circuit, comprising:

a power transistor;

a gate drive circuit connected to drive the gate of said power transistor;

a current-limiting circuit,
operatively connected to receive a signal which indicates the current through said power transistor, and to provide an output accordingly, and
comprising a compensating capacitor and
a limiting circuit which comprises an additional transistor which is in the same technology as said power transistor, and which is configured and connected to limit the voltage on said compensating capacitor to a value which is dependent on the process and temperature variation of said additional transistor.

2. The integrated circuit of claim 1, wherein said power transistor and said additional transistor are both MOS transistors.

3. The integrated circuit of claim 1, wherein said power transistor and said additional transistor have the same size.

4. A circuit for limiting the maximum current to be supplied to a load from a power MOS having respective gate, drain and source terminals, where said load is connected between a terminal of an external voltage supply and the drain terminal of said power MOS, comprising:

a current generator connected to the gate of the power MOS, a resistance connected to the source of the power MOS and to ground, and an amplifier which consists of,
an input stage comprising a pair of bipolar transistors whose bases are connected to each other through a series of two resistances having the same value, and whose collectors are connected to the output terminals of a current mirror circuit, the emitter of the first transistor in said pair being connected to ground and the emitter of the second transistor in said pair being connected to the source of the power MOS, and an equalizing capacitance being connected between the collector and the base of said first transistor, the terminal shared in common by said resistances being connected to a terminal of a voltage reference, an output stage comprising a bipolar transistor of the pnp type having its emitter connected to the gate of said power MOS, collector connected to ground, and base connected to the collector of said first transistor, and circuit means with a one-way current flow, connected between the base of said bipolar transistor and the gate of said power MOS.

5. A circuit as in claim 4, wherein said circuit means with a one-way current flow comprises at least one diode.

6. A circuit as in claim 5, wherein said diode is forward biased to the base of said bipolar transistor.

7. A circuit as in claim 5, wherein said circuit means with a one-way current flow further comprise a second MOS transistor having its gate terminal connected to the anode of said diode, drain terminal connected to the cathode of the latter, and source terminal connected to the gate terminal of said power MOS.

8. A circuit as in claim 7, wherein said second MOS in said circuit means is implemented in the same device technology as said power MOS.

9. A circuit as in claim 7, wherein said diode is implemented by a bipolar transistor of the npn type having its base and emitter connected together, which base is also connected to the base of said pnp bipolar transistor and the gate terminal of said second MOS, and collector connected to the drain terminal of the latter.

10. A circuit as in claim 8, wherein said diode is implemented by a bipolar transistor of the npn type having its base and emitter connected together, which base is also connected to the base of said pnp bipolar transistor and the gate terminal of said second MOS, and collector connected to the drain terminal of the latter.

11. An integrated circuit for controlling a power transistor having a gate terminal, comprising:

a feedback amplifier operatively connected to receive a signal which indicates the current through said power transistor, and to accordingly provide an output which is connected to at least partially control the voltage on said gate terminal;

a compensating capacitor having at least one terminal connected to said output of said amplifier; and a biasing subcircuit which is connected to charge said terminal of said capacitor up to a stable operating voltage before said gate terminal of said power transistor is charged up to a stable operating voltage, when power is first applied;

whereby current through said power transistor is limited, even immediately after power is first applied.

12. The circuit of claim 11, wherein said feedback amplifier comprises first and second bipolar transistors having bases thereof connected together through a resistive bridge.

13. The circuit of claim 11, wherein biasing subcircuit includes a diode-connected transistor which is fabricated in the same technology as said power transistor.

14. An integrated circuit for controlling a power transistor having a gate terminal, comprising:

a feedback amplifier operatively connected to receive a signal which indicates the current through said power transistor, and to accordingly provide a variable output which is connected to at least partially control the voltage on said gate terminal;

a compensating capacitor having at least one terminal operatively connected to said output of said amplifier; and a biasing subcircuit which is connected to charge said terminal of said capacitor, when power is first applied, up to a bias voltage which has the same temperature and process dependence as the threshold voltage of said power transistor;

whereby current through said power transistor is limited, even immediately after power is first applied.

15. The circuit of claim 14, wherein said feedback amplifier comprises first and second bipolar transistors having bases thereof connected together through a resistive bridge.

16. The circuit of claim 14, wherein biasing subcircuit includes a diode-connected transistor which is fabricated in the same technology as said power transistor.

17. A method for operating a power transistor having a gate terminal, comprising the steps of:

(a.) detecting current passed by the power transistor;

(b.) using an amplifier to control current applied to said gate terminal in accordance with said detecting step (a.); said amplifier being stabilized by a compensating capacitor; and (c.) whenever power is first applied to said amplifier, biasing said compensating capacitor to a bias voltage which has the same temperature and process dependence as the threshold voltage of said power transistor.

* * * * *

UNITED STATES PATENT AND TRADEMARK OFFICE
CERTIFICATE OF CORRECTION

PATENT NO. : 5,578,956
DATED : Nov. 26, 1996
INVENTOR(S) : Giorgio Rossi, et al

It is certified that error appears in the above-indentified patent and that said Letters Patent is hereby corrected as shown below:

The title page should be deleted and substitute therefor the attached title page.

Signed and Sealed this

Twenty-seventh Day of October, 1998

*Attest:*

BRUCE LEHMAN

*Attesting Officer*         *Commissioner of Patents and Trademarks*

United States Patent [19]

Rossi et al.

[11] Patent Number: 5,578,956
[45] Date of Patent: Nov. 26, 1996

[54] CIRCUIT FOR LIMITING THE MAXIMUM CURRENT VALUE SUPPLIED TO A LOAD BY A POWER MOS AT POWER-UP

[75] Inventors: Giorgio Rossi, Nerviano; Fabio Marchioó, Sedriano; Liana Luoni, Como; Franco Cocetta, Cornaredo, all of Italy

[73] Assignee: SGS-Thomson Microelectronics, S.r.l., Agrate Brianza, Italy

[21] Appl. No.: 615,729

[22] Filed: Mar. 14, 1996

Related U.S. Application Data

[63] Continuation of Ser. No. 316,042, Sep. 30, 1994, abandoned.

[30] Foreign Application Priority Data

Sep. 30, 1993 [EP] European Pat. Off. ............... 93830400

[51] Int. Cl.$^6$ ....................................................... H03K 5/08
[52] U.S. Cl. ........................ 327/309; 327/325; 327/365
[58] Field of Search ............................... 323/313, 315; 327/72, 108–111, 306, 309, 312, 313, 325, 327, 365, 378, 427, 432, 324, 374, 376, 478, 560, 561, 562, 563; 326/17, 18, 20

[56] References Cited

U.S. PATENT DOCUMENTS 4,777,387  10/1988  Collins ..................................... 327/109
4,833,342   5/1989  Kiryv et al. ............................. 323/313

*Primary Examiner*—Timothy P. Callahan
*Assistant Examiner*—Jeffrey Zweizig
*Attorney, Agent, or Firm*—Robert Groover; Betty Formby

[57] ABSTRACT

The invention concerns a circuit for limiting the maximum current to be supplied to a load through a power MOS, being an improvement of the limiting circuitry which uses an equalizing capacitor. The addition of circuitry with a one-way current flow between a terminal of the equalizing capacitor and the gate terminal of the power MOS is effective to lower the voltage across the capacitor and to speed up its charging process, thereby making the current limiting action expected from the circuit a timely one. The circuitry which limits current flow to one direction may include a second MOS of the same type as the power MOS. In this way, any deviations of the power MOS from its designed operation, e.g. due to its manufacturing process variation and thermal drift phenomena, can also be compensated.

17 Claims, 2 Drawing Sheets

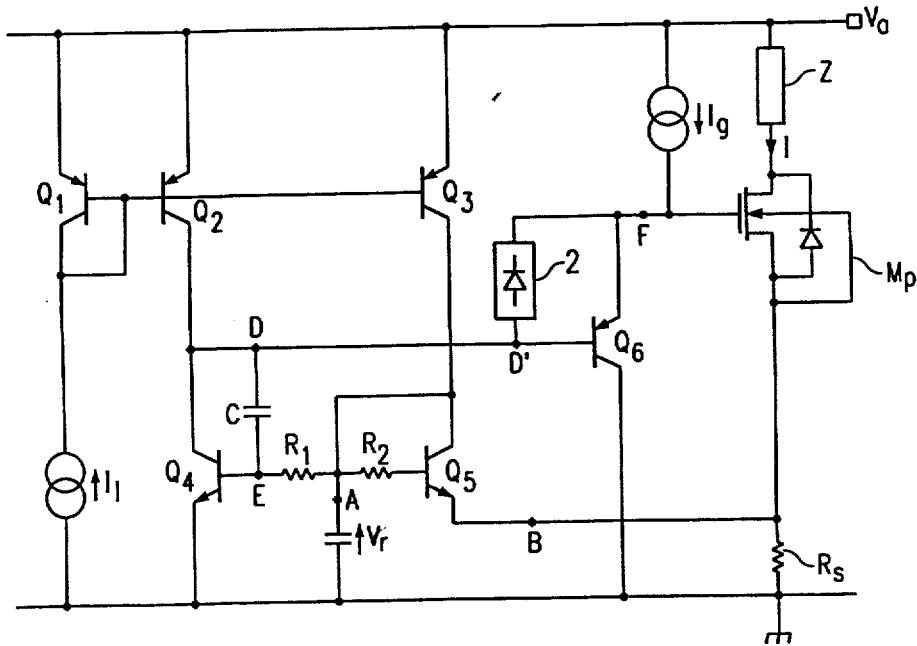

UNITED STATES PATENT AND TRADEMARK OFFICE
CERTIFICATE OF CORRECTION

PATENT NO. : 5,578,956
DATED : 11/26/96
INVENTOR(S) : Rossi et al.

It is certified that error appears in the above-identified patent and that said Letters Patent is hereby corrected as shown below:

Please replace Figure 2 with the drawing below, in which two base-collector connections are sought to be added.

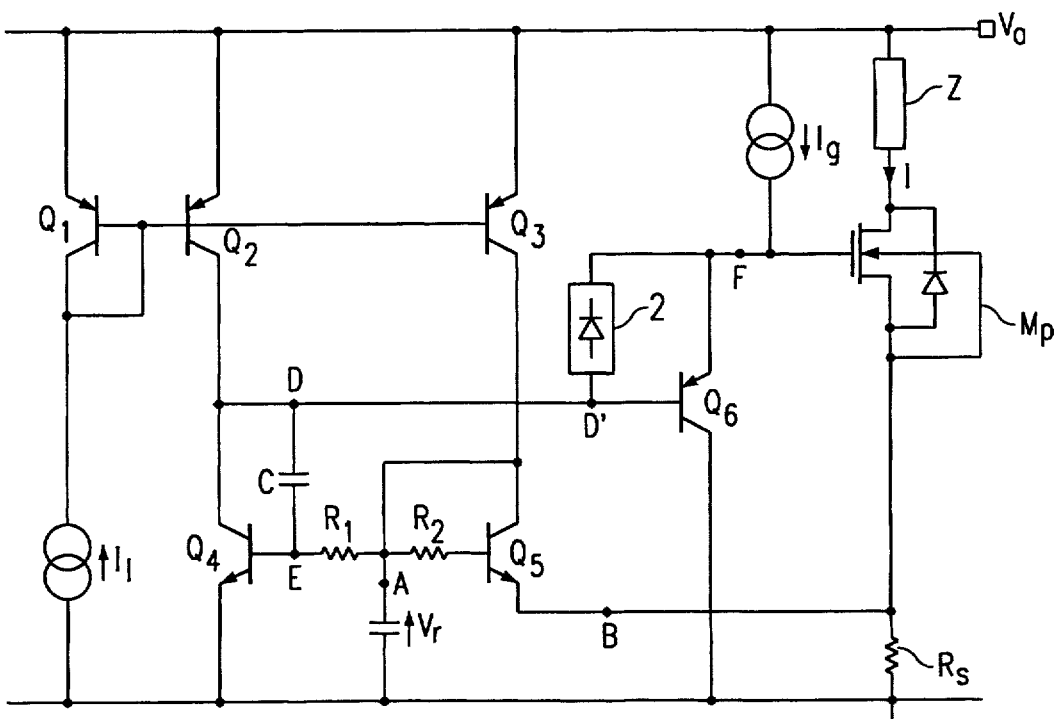

*FIG. 2*